(12) United States Patent
Bao

(10) Patent No.: US 10,637,450 B2
(45) Date of Patent: Apr. 28, 2020

(54) BROADBAND FREQUENCY TRIPLER

(71) Applicant: Telefonaktiebolaget LM Ericsson (publ), Stockholm (SE)

(72) Inventor: Mingquan Bao, Västra Frölunda (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 16/476,318

(22) PCT Filed: Feb. 3, 2017

(86) PCT No.: PCT/EP2017/052330
§ 371 (c)(1),
(2) Date: Jul. 8, 2019

(87) PCT Pub. No.: WO2018/141398
PCT Pub. Date: Aug. 9, 2018

(65) Prior Publication Data
US 2019/0348974 A1    Nov. 14, 2019

(51) Int. Cl.
*H03D 7/12* (2006.01)
*H03K 5/00* (2006.01)
(Continued)

(52) U.S. Cl.
CPC ........... *H03K 5/00006* (2013.01); *H03D 7/12* (2013.01); *H03H 7/0115* (2013.01);
(Continued)

(58) Field of Classification Search
CPC . G06F 7/605; H03D 7/12; H03D 7/14; H03D 7/1433; H03B 19/14
See application file for complete search history.

(56) References Cited

U.S. PATENT DOCUMENTS 5,786,728 A * 7/1998 Alinikula .............. H03F 1/3241
330/149
6,100,731 A * 8/2000 Otaka ...................... H03D 7/12
327/119
(Continued)

FOREIGN PATENT DOCUMENTS

| WO | 2010058247 A1 | 5/2010 |
| WO | 2014029413 A1 | 2/2014 |
| WO | 2016041575 A1 | 3/2016 |

OTHER PUBLICATIONS

Kiuru, T. et al., "Compact Broadband MMIC Schottky Frequency Tripler for 75-140 GHz", Proceedings of the 6th European Microwave Integrated Circuits Conference, Oct. 10, 2011, pp. 108-111, EuMA.
(Continued)

*Primary Examiner* — Thomas J. Hiltunen
(74) *Attorney, Agent, or Firm* — Coats & Bennett, PLLC

(57) ABSTRACT

A frequency multiplier (200) generates an output signal with a frequency 3 times of the input signal frequency. The frequency multiplier (200) comprises four cascaded stages. A first stage (201) is configured to receive an input signal and generate harmonics signals of the input signal. A second stage (202) is a passive filter, a frequency response of the passive filter has either a peak or a dip around an upper frequency end of a frequency band of the input signal. A third stage (203) is configured to mix the 1st and the 2nd order harmonics signals to generate 3rd order harmonic signals. A fourth stage (204) is configured to suppress the 1st and even-order harmonics signals and output a signal dominated with a frequency 3 times of the input signal frequency.

10 Claims, 9 Drawing Sheets

(51) Int. Cl.
  *H03H 7/01* (2006.01)
  *H03H 7/38* (2006.01)
  *H04B 1/40* (2015.01)

(52) U.S. Cl.
  CPC .......... *H03H 7/0123* (2013.01); *H03H 7/383* (2013.01); *H04B 1/40* (2013.01)

(56) References Cited

U.S. PATENT DOCUMENTS

| | | | | |
|---|---|---|---|---|
| 6,369,675 | B2 | 4/2002 | Yamada | |
| 6,388,546 | B1 | 5/2002 | Kikokawa et al. | |
| 6,707,344 | B2* | 3/2004 | Cargill | H03B 19/14 331/117 R |
| 7,759,988 | B2* | 7/2010 | Lu | H03B 19/14 327/116 |
| 7,839,199 | B2* | 11/2010 | Kuo | G06F 7/68 327/356 |
| 8,237,472 | B2* | 8/2012 | Kuo | H03B 19/00 327/116 |
| 8,729,932 | B2* | 5/2014 | Chiesa | H03B 27/00 327/116 |
| 8,901,973 | B2* | 12/2014 | Ehlers | H03B 19/14 327/119 |
| 9,306,496 | B2* | 4/2016 | Kuo | H03B 19/00 |
| 9,680,454 | B2* | 6/2017 | Chueh | H03B 19/14 |
| 9,966,937 | B2* | 5/2018 | Yayla | H03K 3/0315 |
| 10,326,432 | B2* | 6/2019 | Lee | H03B 5/1228 |
| 2007/0049236 | A1 | 3/2007 | Naito | |
| 2008/0258783 | A1* | 10/2008 | Petrovic | H03B 19/06 327/119 |
| 2011/0187420 | A1 | 8/2011 | Kuo et al. | |

OTHER PUBLICATIONS

Bryllert, T. et al., "A Broadband Heterostructure Barrier Varactor Tripler Source", 2010 IEEE MTT-S International Microwave Symposium, May 23, 2010, pp. 344-347, IEEE.

Bao, M. et al., "A High Power-Efficiency D-Band Frequency Tripler MMIC With Gain Up to 7 dB", IEEE Microwave and Wireless Components Letters, vol. 24 No. 2, Feb. 1, 2014, pp. 123-125, IEEE.

Chen, G. et al., "A 60-110 GHz Low Conversion Loss Tripler in 0.15-μm MHEMT Process", 2009 Asia Pacific Microwave Conference, Dec. 7, 2009, pp. 377-380, IEEE.

* cited by examiner

BROADBAND FREQUENCY TRIPLER

TECHNICAL FIELD

Embodiments herein relate to a frequency multiplier and a method therein. In particular, they relate to a broadband frequency tripler for generating an output signal with a frequency 3 times of an input signal and an electronic device comprising the frequency tripler.

BACKGROUND

Wireless communication devices usually comprise transceivers which comprise receivers and transmitters. A frequency multiplier, together with a low frequency oscillator, is able to provide high purity and stable signal sources for a transceiver in a wireless communication device. The frequency multiplier multiplies an input signal with a low frequency fin, to an output signal with a desired high frequency fout, where fout=n*fin, and n is an integer multiplication factor. For example, a frequency tripler can convert an input signal frequency with fin to fout=3fin. A bandwidth of a frequency multiplier refers to a frequency range of the output signal. A broadband frequency multiplier can be applied in multi-band transceivers, as well as a high-resolution Frequency Modulated Continuous Wave (FMCW) radar. Up to now, a broadband frequency tripler is usually made up of two diodes, as shown in FIG. 1, achieving a wide 3-dB bandwidth from 80 GHz to 110 GHz. For example, in Gui-Yu Chen. et al., "A 60-110 GHz Low Conversion Loss Tripler in 0.15-um MHEMT Process", IEEE Microwave Wireless Component Letter, 2016, in Tomas Bryllert et al., "A Broadband Heterostructure Barrier Varactor Tripler Source", IEEE International Microwave Symposium (MTT-S), 2010, and in Tero Kiuru et al., "Compact Broadband MMIC Schottky Frequency Tripler for 75-140 GHz", Proceedings of the 6th European Microwave Integrated Circuits Conference, pp 108-110, 2011, diode triplers are disclosed.

Unfortunately, a frequency tripler built by diodes has a large conversion loss, and requires a large input power. Typically, such kind of tripler has a conversion loss around 20 dB with an input power of 15 dBm. Therefore, it is necessary to have a power amplifier at the output and another power amplifier at the input, to boost the output/input power. Such kind of multiplier chain consumes a lot of Direct Current (DC) power.

On the other hand, a frequency tripler built by transistors has probably a positive conversion gain, driven by a relative low input power. For example, a D-band frequency tripler in M. Bao et al., "A high power-efficiency D-band frequency tripler MMIC with gain up to 7 dB," IEEE Microwave Wireless Component Letter, vol. 24, no. 2, pp. 123-125, February 2014, has a conversion gain of 7 dB with an input power of 3 dBm. However, the transistor tripler has a narrow 3-dB frequency bandwidth of 16 GHz, i.e. from 119 GHz to 135 GHz.

SUMMARY

Therefor it is an object of embodiments herein to provide a frequency multiplier with improved performance.

According to a first aspect of embodiments herein, the object is achieved by a frequency multiplier for generating an output signal from an input signal. A frequency of the output signal is 3 times of a frequency of the input signal. The frequency multiplier comprises a first stage configured to receive an input signal and generate harmonics signals of the input signal. The frequency multiplier further comprises a second stage comprising a passive filter, wherein a frequency response of the passive filter has either a peak or a dip at an upper frequency end of a frequency range of the input signal such that at output of the second stage, either a power of the 1 st order harmonic signal decrease and a power of the 2nd order harmonic signal increases when the input signal frequency increases, or a power of the 1st order harmonic signal increases and a power of the 2nd order harmonic signal decreases when the input signal frequency increases.

The frequency multiplier further comprises a third stage configured to mix the 1st and the 2nd order harmonics signals to generate 3rd order harmonic signals and a fourth stage configured to suppress the 1st and even-order harmonics signals and output a signal dominated with a frequency 3 times of the input signal frequency.

According to a second aspect of embodiments herein, the object is also achieved by corresponding embodiments of a method in a frequency multiplier for generating an output signal with a frequency 3 times of an input signal. The method comprises generating harmonics signals of the input signal in a first stage by a common-emitter configured transistor pair and shaping the generated harmonics signals in a second stage such that at output of the second stage, either a power of the 1 st order harmonic signal decrease and a power of the 2nd order harmonic signal increases when the input signal frequency increases, or a power of the 1st order harmonic signal increases and a power of the 2nd order harmonic signal decreases when the input signal frequency increases. The method further comprises mixing 1st and the 2nd order harmonics signals to generate 3rd order harmonic signals in a third stage by a trans-conductance mixer comprising a common-emitter configured transistor pair and suppressing the 1st and even-order harmonics signals in a fourth stage by two coupled transmission lines and a capacitor and inductor network.

The frequency multiplier according to the embodiments herein is built by transistors which has 4 cascaded stages. The first stage generates the 1st and the 2nd order, as well as other high-order harmonics signals. The second stage is a passive filter, which manipulates the amplitude of the harmonics signals such that at the output of the filter, either the power of the 1st order harmonic signal increases and the power of the 2nd order harmonic signal decreases, when the input signal frequency increases; or the power of the 1st order harmonic signal decreases and the power of the 2nd order harmonic signal increases, when the input signal frequency increases. In this way, in the third stage a large 1st order harmonic signal is always mixed with a small 2nd order harmonic signal, or a small 1st order harmonic signals is always mixed with a large 2nd order harmonic signal. Consequently, the mixing product i.e. the 3rd order harmonic signal has a flat output power within the bandwidth of the input signal since the amplitude of the mixing product is determined by the amplitudes of two input signals. The last stage suppresses the undesired 1st, 2nd and the 4th order harmonics signals by utilizing impedance differences of two coupled transmission lines for the odd-order harmonics signals and the even-order harmonics signals with minimum damage to the 3rd order harmonic signal. Therefore a wide bandwidth can be achieved for the frequency multiplier according to the embodiments herein.

The frequency multiplier according to the embodiments herein may achieve 0 dB conversion gain with an input power of 5 dBm. Comparing with the prior art tripler built with diodes, the frequency multiplier according to the embodiments herein achieves a similar frequency bandwidth with high conversion gain at low input power.

Thus, embodiments herein provide a frequency multiplier with improved performance on conversion gain, bandwidth and power efficiency.

BRIEF DESCRIPTION OF THE DRAWINGS

Examples of embodiments herein are described in more detail with reference to attached drawings in which.

DETAILED DESCRIPTION

Design a broadband frequency multiplier e.g. a tripler, needs to solve two problems. First, getting an approximately equal output power of the 3rd order harmonic signal over a wide frequency range; Second, suppressing undesired harmonics, such as the 1st, the 2nd and the 4th order harmonics etc., over a wide frequency range. The undesired 2nd or the 4th order harmonics signals are probably located inside the tripler's output frequency range, and a band-pass filter does not work in this case, since the band-pass filter suppresses the 3rd order harmonic signal and other undesired harmonics simultaneously.

Figure 1:
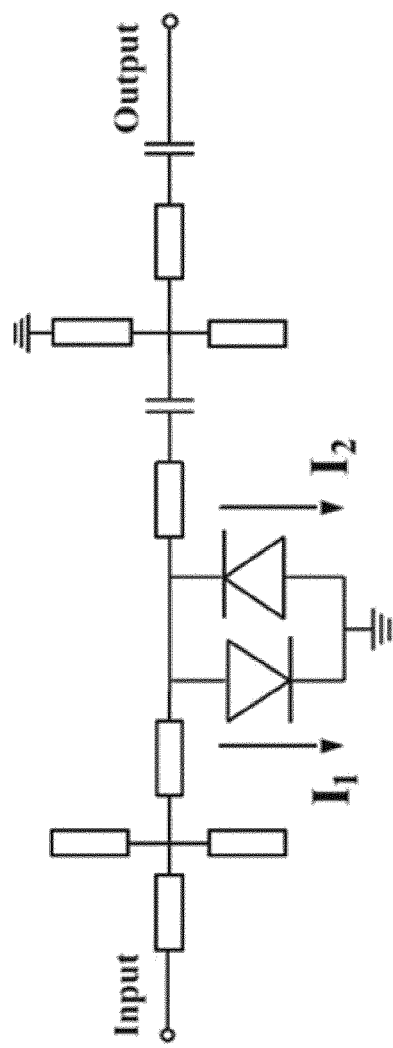
FIG. 1 is a simplified circuit schematic of a frequency tripler according to prior art.
Figure 2:
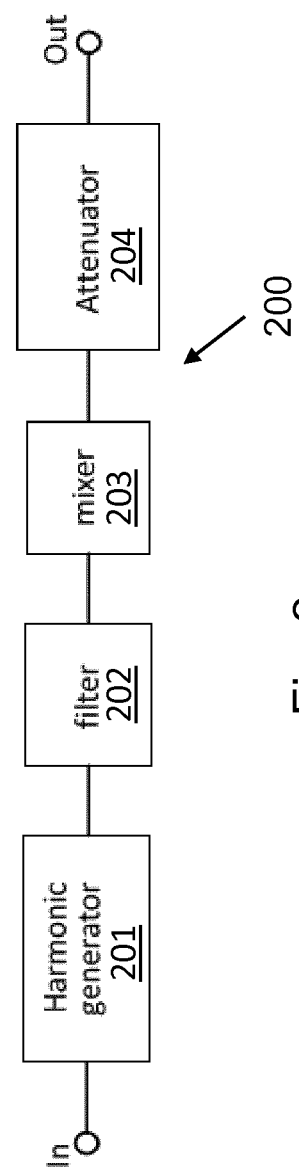
FIG. 2 is a general view of a frequency multiplier according to embodiments herein.

To solve these problems, a frequency multiplier according to embodiments herein is proposed. A general view of a frequency multiplier 200 i.e. a frequency tripler 200, for generating an output signal with a frequency 3 times of an input signal frequency is shown in FIG. 2. The frequency multiplier 200 comprises four cascaded stages, a first stage 201, a second stage 202, a third stage 203, a fourth stage 204.

The first stage 201 is a harmonic generator and is configured to receive an input signal In and generate 1st and 2nd order harmonics signals of the input signal, as well as other high-order, e.g. 4th and 6th order harmonics of the input signal.

The second stage 202 is a passive filter, wherein a frequency response of the passive filter has either a peak or a dip at an upper frequency end of a frequency band of the input signal. This will be further discussed in the following.

The third stage 203 is a mixer and is configured to mix the 1st and the 2nd order harmonics signals to generate 3rd order harmonic signal.

The fourth stage 204 is an attenuator and is configured to suppress the 1st and even-order harmonics signals and output a signal dominated with a frequency 3 times of the input signal frequency.

Figure 3:
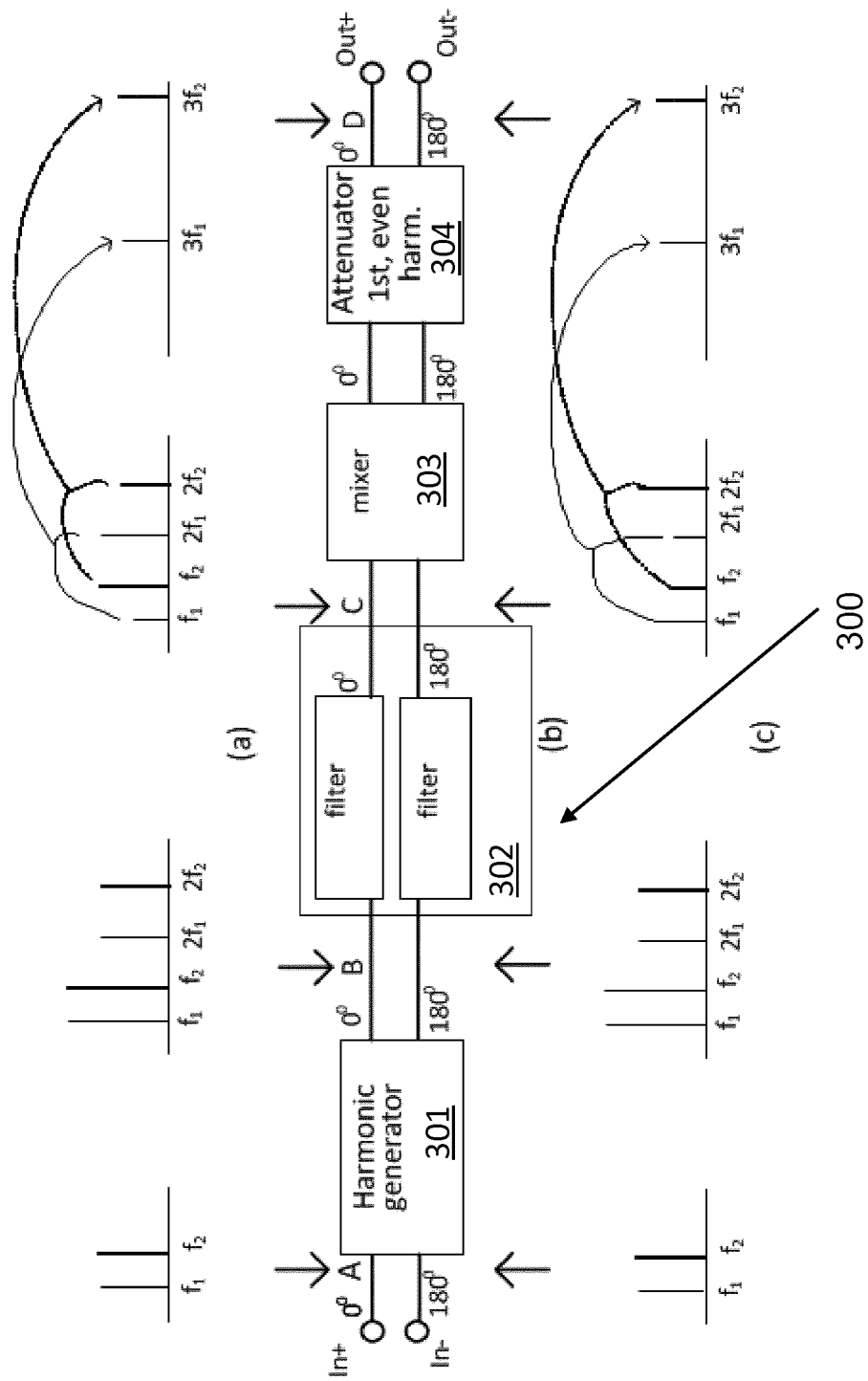
FIG. 3(b) is a general view illustrating a frequency multiplier according to embodiments herein, (a) and (c) are diagrams illustrating signal spectrums at different input/output points of the frequency multiplier shown in (b)

The performance of the frequency multiplier according to embodiments herein will be further discussed in detail with reference to FIG. 3, where FIG. 3(b) shows a general block view of a frequency multiplier 300, FIGS. 3(a) and (c) show spectrum components of input signal and output signals of each stage for different frequency responses of the filter in the second stage.

The frequency tripler 300 comprises four cascaded stages, a first stage 301, a second stage 302, a third stage 303, a fourth stage 304 and has balanced circuit topology, driven by differential input signals In+/In−. The first stage 301 generates the 1st, the 2nd, the 3rd order etc. harmonics signals of the input signal. For example, when a differential input signal at a frequency of $f_1$ is applied at the input of the first stage, the 1st and the 2nd order etc., harmonics signals at frequencies $f_1, 2f_1, \ldots$, are obtained at the output of the first stage 301, i.e. point B, as shown in 3(b). In other case, when a differential input signal at a frequency of $f_2$ is applied, the harmonics signals at frequencies $f_2, 2f_2, \ldots$, can be obtained too. It assumed that the input signal has a frequency band, where $f_1$ and $f_2$ are lower frequency end and upper frequency end of the input signal frequency band, respectively.

The first stage 301 may be made up of two parallel common-emitter configured transistors. So according to some embodiments herein the first stage 301 may comprise a common-emitter configured transistor pair having two inputs to receive a differential input signal and two outputs to generate harmonics signals for the second stage 302. Usually, the 1st order harmonic signal has a larger amplitude than that of the other order harmonics. The 2nd order harmonic may need to be maximized by choosing a proper base bias for the transistor pair.

The first stage 301 has two outputs from the transistors' collectors. Each harmonic signal at two outputs has the same amplitude. But the odd-order harmonics signals at two outputs have a phase difference of 180°, i.e. $\varphi_{2n+1}=(2n+1)\pi$, while, the even-order harmonics signals have a phase differences of 0°, i.e. $\varphi_{2n}=2n\pi$. Namely, for the odd-order harmonics signals, the output of the first stage 301 is a differential signal, but for the even-order harmonics signals, the output of the first stage 301 is a common-mode signal. This feature will be used to suppress even-order harmonics signals at the fourth stage 304.

Figure 4:
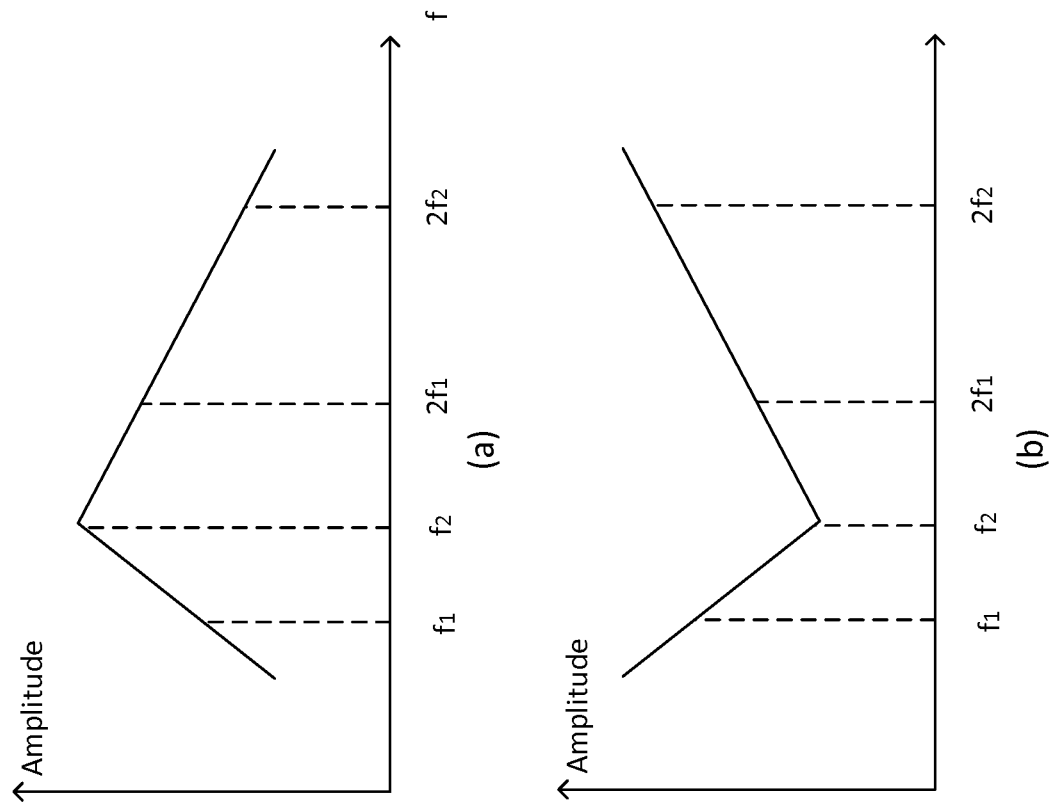
FIG. 4 is a diagram illustrating frequency responses of a filter according to embodiments herein.

The second stage 302 is a filter, which may comprise passive components, such as inductors or transmission lines and capacitors. The filter's frequency response has either a peak or a dip around $f_2$ i.e. the upper frequency end of the input signal frequency band, as shown in FIGS. 4(a) and (b). In the former case, the output signal spectrum of the filter, i.e. at point C, is plotted in FIG. 3(a). As shown both in FIGS. 3 and 4(a), the amplitude of the 1st order harmonic signal increases as the input signal frequency increases; simultaneously, the 2nd order harmonic signal decreases as the input signal frequency increases. In the latter case, the output signal spectrum is plotted in FIG. 3(c), the amplitude of the 1st order harmonic signal decreases as the input signal frequency increases; simultaneously, the 2nd order harmonic signal increases as the input signal frequency increases.

Therefore according to embodiments herein, the frequency response of the second stage 202, 302 has either a peak or a dip around the upper frequency end of the input signal frequency band such that at outputs of the second stage 202, 302, either a power of the 1st order harmonic signal increases and a power of the 2nd order harmonic signal decreases when the input signal frequency increases, or a power of the 1st order harmonic signal decreases and a power of the 2nd order harmonic signal increases when the input signal frequency increases.

In this embodiment, two identical filters are used in the balanced circuit, keeping the phase difference of all harmonics signals unchanged at the outputs of the filters.

In principle, a filter is applicable, which is able to keep the amplitude of the 1st order harmonic signal equal within a wide input signal frequency range, simultaneously, to keep the amplitude of the 2nd order harmonic signal equal within a wide input signal frequency range.

The third stage 301 is a mixer, mixing the 1st and the 2nd order harmonics signals to produce the 3rd order harmonic signal. Due to the characterization of the filter frequency response, for example, when the filter frequency response has a peak around $f_2$, a small amplitude of the 1st order harmonic signal at $f_1$ mixes with a large amplitude of the 2nd order harmonic signal at $2f_1$, while a large amplitude of the 1st order harmonic signal at $f_2$ mixes with a small amplitude of the 2nd order harmonic signal at $2f_2$, as shown in FIG. 3(a). In other case, i.e. when the filter frequency response has a dip around $f_2$, a large amplitude of the 1st order harmonic signal at $f_1$ mixes with a small amplitude of the 2nd order harmonic signal at $2f_1$, while a small amplitude of the 1st order harmonic signal at $f_2$ mixes with a large amplitude of the 2nd order harmonic signal at $2f_2$, as shown in FIG. 3(c).

The amplitude of the mixing product 3f is determined by the amplitudes of two input signals f and 2f. A small amplitude of the 1st order harmonic signal mixes with a large amplitude of the 2nd order harmonic signal produces a mixing product, i.e. the 3rd order harmonic signal. This 3rd order harmonic signal has an approximately equal amplitude to the mixing product getting from a large amplitude of the 1st order harmonic signal and a small amplitude of the 2nd order harmonic signal. This is the reason that the output of the frequency tripler 200, 300 has almost equal output signal amplitudes within the input signal frequency band $f_2$-$f_1$.

A common-emitter configured transistor may be used as a mixer. The harmonics signals, such as the 1st and the 2nd etc., are applied at a base of the transistor. The mixing products, i.e. the 3rd order harmonic signal are taken from a collector of the transistor. Such kind of mixer is a so-called trans-conductance mixer.

Therefore, according to embodiments herein, the third stage 303 may comprise a common-emitter configured transistor pair acting as a trans-conductance mixer to mix the 1st and the 2nd order harmonics signals, wherein the common-emitter configured transistor pair has two inputs to receive signals from the second stage 302 and two outputs to provide mixed signals to the fourth stage 304.

For a broadband tripler, it is impossible to suppress undesired harmonics by utilizing a band-pass filter, when the adjacent harmonics like the 2nd and the 4th order harmonics signals are located within the frequency range of the desired output signal. Since a band-pass filter cannot suppress the undesired harmonics signals without damage to the 3rd order harmonic signal.

According to embodiments herein, two coupled transmission lines may be used to suppress the even-order harmonics signals.

Figure 5:
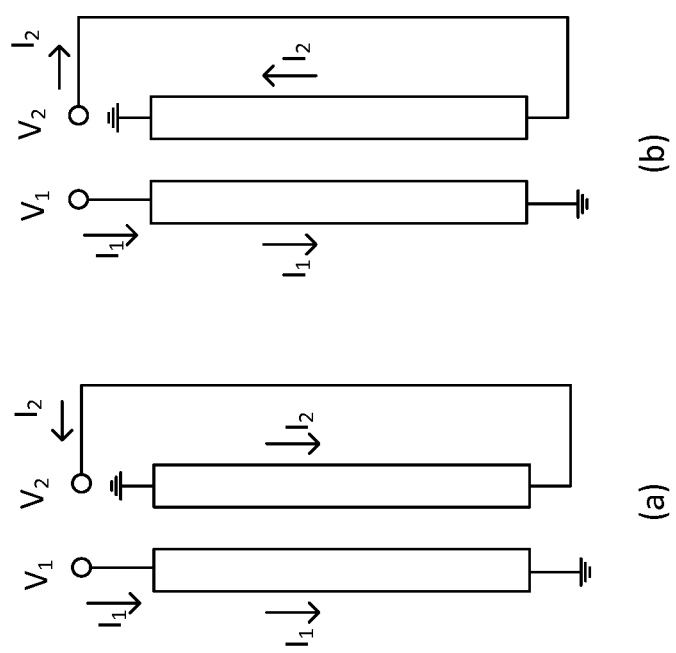
FIG. 5 is a schematic view of two coupled transmission lines according to embodiments herein.

So in the fourth stage 204, 304, there are two coupled transmission lines or inductors as shown in FIG. 5. It is known that the total impedance, $Z_l$ (l=1,2), of each line is given by $$Z_l = j\omega L_{s,l} \mp j\omega M (l=1,2) \qquad (1)$$

where $L_{s,l}$ denotes self-inductance of the transmission line, i.e., the inductance without the coupled line. M denotes the mutual inductance of two transmission lines. When currents in the two transmission lines flow in the same direction, the sign of M is positive; when the currents flow in the opposite direction, the sign of M is negative. The mutual inductance is given by $$M = k\sqrt{L_1 L_2} \qquad (2)$$

where k is the coupling coefficient, $|k| \le 1$, and $L_1$ and $L_2$ are self-inductance of the two transmission lines respectively.

As shown in FIG. 5, each transmission line has a grounded terminal. Two inputs $V_1$, $V_2$ are connected with two lines separately. The two inputs $V_1$ and $V_2$ are located on the opposite sides. For the odd-order harmonics, the phase difference of two inputs is 180°. So the currents containing the odd-order harmonics signal flow in the same direction, as the currents $I_1$ and $I_2$ shown in FIG. 5(a). For the even-order harmonics, the phase difference of two inputs is 0. So the currents containing the even-order harmonics signals flow in the opposite direction, as the currents $I_1$ and $I_2$ shown in FIG. 5(b). Therefore, impedance of the coupled transmission lines between the input and ground is given by $$Z_n = j\omega L_{s,n} + j\omega M, \text{ for odd-order harmonics}$$

$$Z_n = j\omega L_{s,n} - j\omega M, \text{ for even-order harmonics} \qquad (3)$$

This impedance difference can be utilized to suppress the even-order harmonics signals. If the impedance is low enough, the even-order harmonics signals would go to ground, instead to the output port.

At the same time, the coupled transmission lines with one grounded terminal should be short enough to provide a low impedance path to ground for the undesired 1st order harmonic signal, to suppress the 1st order harmonic signals.

Figure 6:
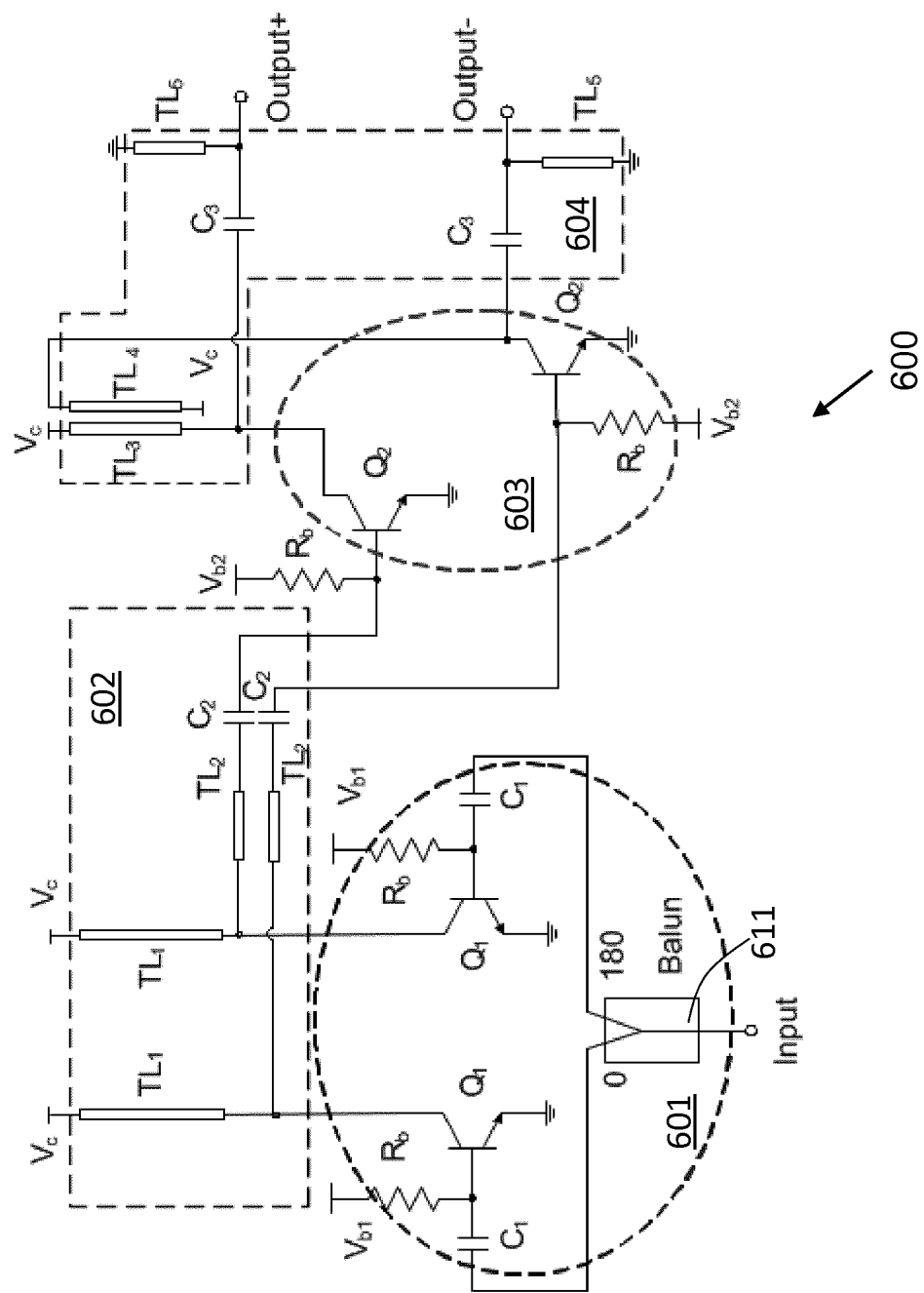
FIG. 6 is a circuit schematic showing a frequency multiplier according to embodiments herein.

According to some embodiments herein, the frequency multiplier 200, 300 may be implemented by circuits shown in FIG. 6, where the first stage 201, 301 may be implemented by a circuit referred to as a first stage 601, the second stage 202, 302 may be implemented by a circuit referred to as a second stage 602, the third stage 203, 303 may be implemented by a circuit referred to as a third stage 603, and the fourth stage 204, 304 may be implemented by a circuit referred to as a fourth stage 604.

As shown in FIG. 6, the first stage 601 may comprise a balun 611 and a transistor pair Q1/Q1. The balun 611 transfers a single-ended input signal into differential signals. Two outputs of the balun have an 180° phase difference and have the same amplitude. The differential outputs from the balun 611 are applied at bases of two transistors Q1/Q1 via capacitors C1/C1, separately. Two outputs of the first stage 601 are taken from collectors of the two transistors Q1/Q1. Two transistors Q1/Q1 are biased with base bias voltage $V_{b1}$ in a manner that to maximize the 2nd order harmonic. Emitters of the two transistors are grounded.

Two outputs of the first stage 601 are connected to the second stage 602. The second stage 602 may comprise two identical filters each being connected to one output of the first stage 601. Each filter may comprise a first inductor or transmission line $TL_1$ and a second inductor or transmission line $TL_2$ connected in series with a capacitor $C_2$. One terminal of the first inductor $TL_1$ is connected with one terminal of the second inductor $TL_2$ and to one output of the first stage 601, another terminal of the first inductor $TL_1$ is connected to an alternating current (ac) ground, i.e., a voltage supplier Vc, one terminal of the capacitor $C_2$ is an output of the filter, which is connected to an input of the third stage 603, i.e. a base of transistor Q2.

Figure 7:
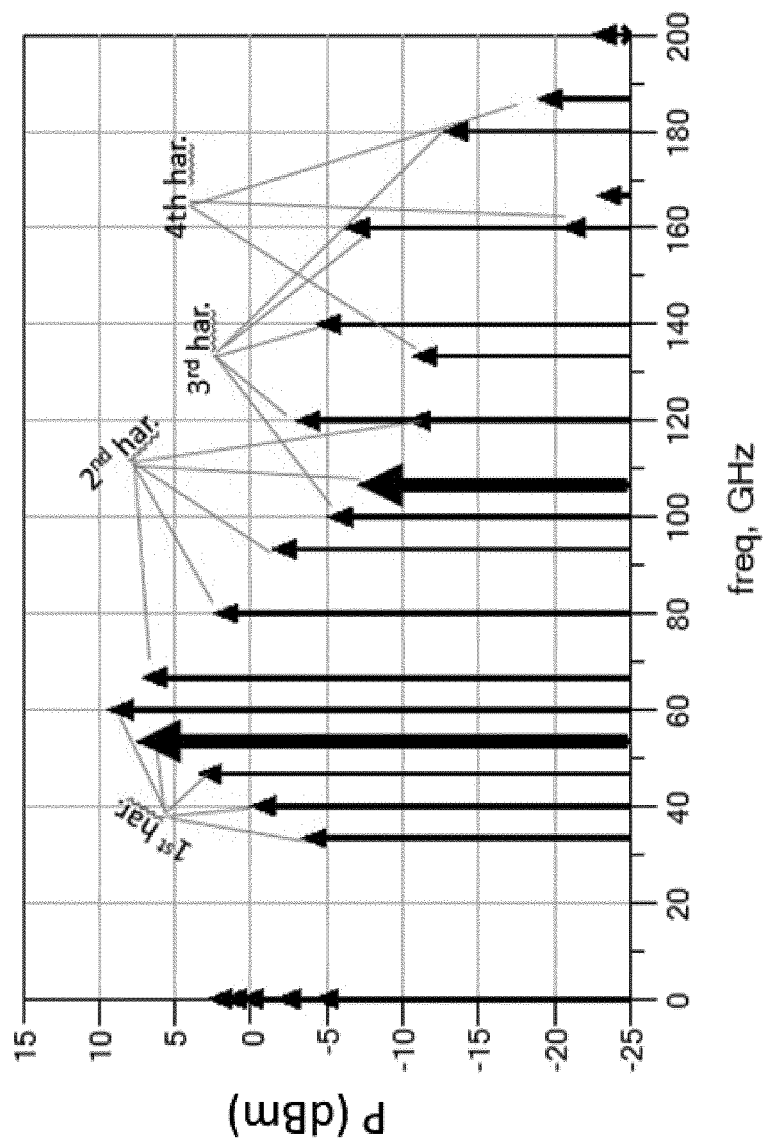
FIG. 7 is a diagram showing output signal spectrums of a filter according to embodiments herein.

By proper choice of the length of $TL_1$ and $TL_2$, as well as capacitance of $C_2$, the filter's frequency response has a peak at the upper frequency end $f_2$ of the input signal frequency band. The transistors' Q1, Q2 parasitic components, i.e. resistors and capacitors also should be taken into account in the filter design. The desired output of the filter is that the amplitude of the 1st order harmonic signal increases when the input signal frequency increases, but the amplitude of the 2nd order harmonic signal decreases. This is shown in FIG. 7, where signal spectrums at input of the third stage 603, i.e., the base of Q2 are shown. The signal spectrums at different input signal frequencies with the input signal power of 5 dBm are plotted in FIG. 7. The input signal frequencies vary from 33.3 GHz to 60 GHz with a frequency step of 6.675 GHz.

The third stage 603 may comprise two transistors Q2/Q2, i.e. a common-emitter configured transistor pair acting as a trans-conductance mixer to mix the 1st and the 2nd order harmonics signals. The common-emitter configured transistor pair has two inputs to receive signals from the second stage 602 and two outputs to provide mixed signals to the fourth stage 604. As shown in FIG. 6, emitters of Q2/Q2 are grounded. Collectors of Q2/Q2 are the two outputs of the third stage 603, which generate mixing products of the 1st and the 2nd order harmonics signals. A large 1st order harmonic signal is always mixed with a small 2nd order harmonic signal, or a small 1st order harmonic signal is always mixed with a large 2nd order harmonic signal. For instance, at frequency 53. 3 GHz, the power of the 1st order harmonic signal is larger than that of the 2nd order harmonic signal at frequency of 106.6 GHz, shown by bold arrows in FIG. 7.

Figure 8:
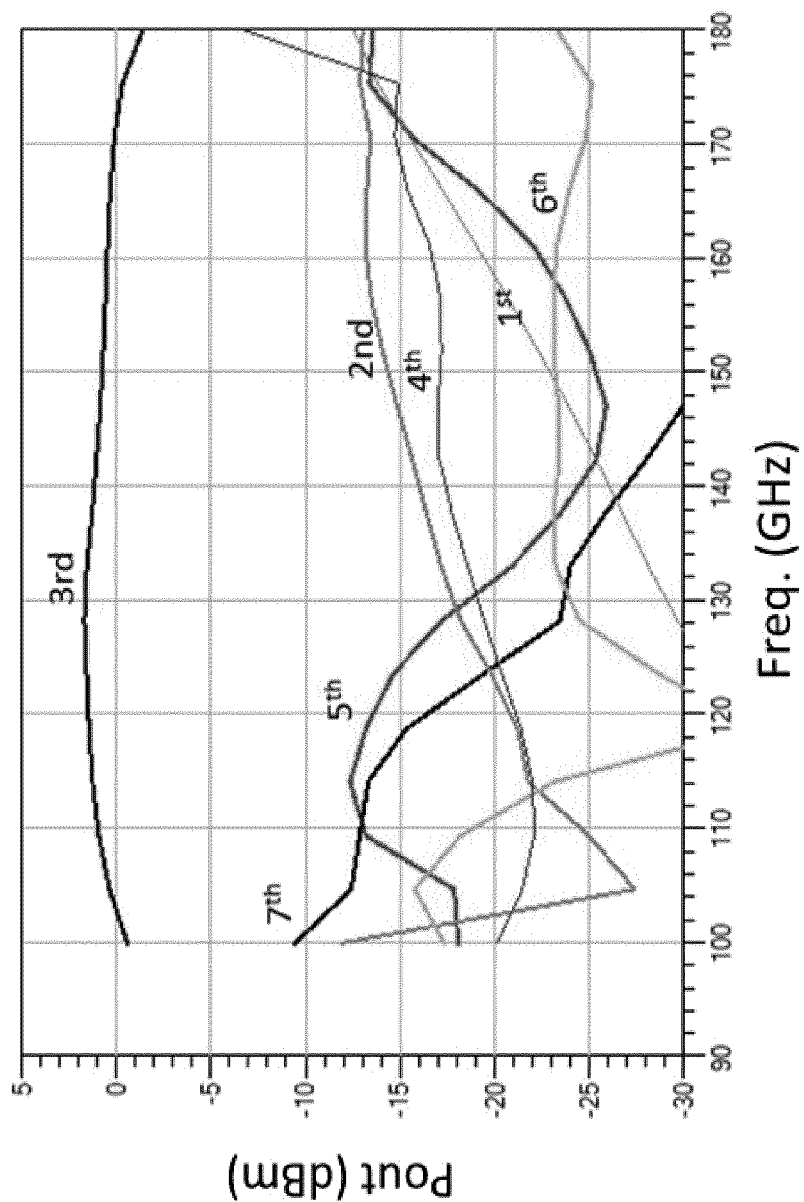
FIG. 8 is a diagram showing output powers of different order harmonics versus input signal frequencies for a frequency multiplier according to embodiments herein.

These two harmonics can generate the 3rd order harmonic signal at 159.9 GHz. By manipulating the amplitudes of the two input signals of the mixer in the filter of the second stage 602, the mixing product, the 3rd order harmonic signal, has an almost equal output power over a frequency range of 100 GHz-180 GHz, as shown in FIG. 8. Its 3-dB bandwidth is 65 GHz, from 105 GHz to 170 GHz. The relative bandwidth is 46.4%. The maximum output power is about 3 dBm with a DC power consumption of 65 mW.

For a broadband tripler, the undesired harmonics, i.e. the 2nd and the 4th order harmonics signals, may be in the tripler's output frequency band. For example, the multiplier 600 mentioned above has an output frequency range from 105 GHz to 170 GHz. When the input signal's frequency $f_{in}$ is at a lower frequency end, i.e. $f_{in}$=36.66 GHz, both the 3rd order harmonic signal at 110 GHz and the 4th order harmonic signal at frequency of 146.6 GHz are within the tripler's output frequency range. While, when the input signal frequency is at an upper frequency end, i.e. $f_{in}$=53.33 GHz, both the 3rd order harmonic signal at 160 GHz and the 2nd order harmonic signal at 106.6 GHz are within the tripler's output frequency range.

In order to remove the 2nd and the 4th order harmonics signals, in the fourth stage 604, two coupled inductors, i.e. two coupled transmission lines $TL_3$, $TL_4$ are used, as shown in FIG. 6. Two terminals on opposite sides of the coupled transmission lines $TL_3/TL4$ are connected to the two outputs of the third stage 603 respectively. In other words, the outputs of the third stage 603, i.e., the collectors of Q2/Q2 are connected with the coupled transmission lines $TL_3/TL_4$ on the opposite sides. Two another terminal of the coupled transmission lines $TL_3/TL_4$ are ac grounded, i.e., are connected to a DC voltage supplier Vc. For odd-order harmonics, a large impedance of the coupled transmission lines to ground prevents the odd-order harmonics signal from grounding; while, for even-order harmonics, a small impedance to ground results in that most of the even-order harmonics signals go to ground. Therefore, the even-order harmonics signals are suppressed.

Furthermore, by proper choosing the length of the coupled transmission lines $TL_3/TL_4$, the impedance of the coupled transmission lines may be small enough to ground the 1st order harmonic signal. Simultaneously, the impedance of the coupled transmission lines $TL_3/TL_4$ is large enough to prevent the 3rd order harmonic signal from grounding. Because, for a given inductor or a transmission line, its impedance for the 1st order harmonic signal is equal to one-third of that for the 3rd order harmonic signal. The coupled transmission lines $TL_3/TL_4$ has an extra function to suppress the 1st order harmonic signal.

The fourth stage 604 may further comprise a capacitor $C_3$ and inductor or transmission line $TL_5$ network. The capacitor $C_3$ blocks the DC and the 1st order harmonic signal to the output. Besides, the capacitor $C_3$ and the shunt inductor $TL_5$ are also used for impedance matching. As a result, the multiplier 600 demonstrates at least 12 dBc rejection ratio of the undesired 1st, the 2nd and the 4th order harmonics signals in the output frequency range.

Figure 9:
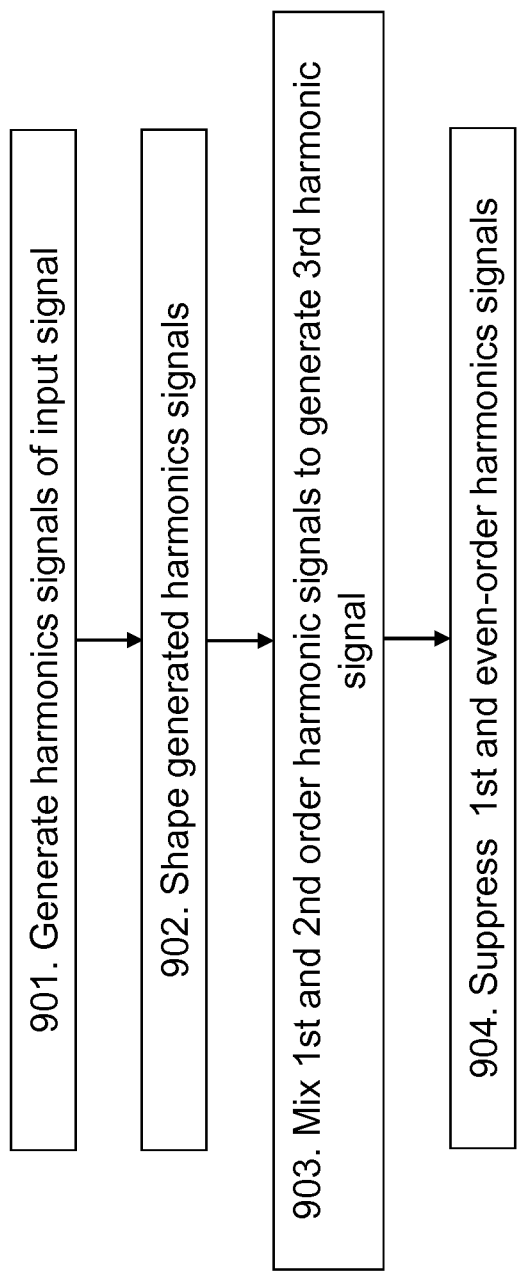
FIG. 9 is a flow chart illustrating a method performed in a frequency multiplier according to embodiments herein.

Corresponding embodiments of a method in the frequency multiplier 200, 300, 600 for generating an output signal with a frequency 3 times of an input signal frequency will now be described with reference to FIG. 9. As mentioned above, the frequency multiplier 200, 300, 600 comprises the first stage 201,301, 601, the second stage 202,302, 602, the third stage 203,303, 603 and the fourth stage 204,304, 604. The method comprises the following actions.

Action 901

The first stage 201,301, 601 of the frequency multiplier 200, 300, 600 generates harmonics signals of the input signal by a common-emitter configured transistor pair.

Action 902

The second stage 202, 302, 602 of the frequency multiplier 200, 300, 600 shapes the generated harmonics signals such that at outputs of the second stage, either a power of the 1st order harmonic signal decrease and a power of the 2nd order harmonic signal increases when the input signal frequency increases, or a power of the 1st order harmonic signal increases and a power of the 2nd order harmonic signal decreases when the input signal frequency increases.

Action 903

The third stage 203, 303, 603 of the frequency multiplier 200,300, 600 mixes the 1st and the 2nd order harmonic signals to generate 3rd order harmonic signals by a trans-conductance mixer comprising a common-emitter configured transistor pair.

Action 904

The fourth stage 204,304, 604 of the frequency multiplier 200,300, 600 suppresses the 1st and even-order harmonics signals by two coupled transmission lines and a capacitor and inductor network.

To summarize, the frequency multiplier 200, 300, 600 according to embodiments herein is a broadband frequency tripler thanks to the frequency response characterization of its filter, i.e. the filter has either a peak or a dip at the upper frequency end of the input signal frequency band so that two input harmonics signals, i.e. the 1st and 2nd order harmonics signals, to the mixer are shaped as desired over the input signal frequency band. In this way, the 3rd order harmonic signal, i.e. the mixing product of the two input signal, has almost equal amplitude over a wide frequency range. Further, by utilizing the balanced circuit topology, together with the coupled transmission lines, it is possible to suppress the even-order harmonics signals over a wide frequency bandwidth without a significant damage of the 3rd order harmonic signal even when those even-order harmonics signals are inside the output frequency band of the tripler. Further, a conversion gain of the multiplier 200, 300, 600 may approach zero and the input power is relative small, e.g. 5 dBm. Comparing with the existing diode triplers, the multiplier 200, 300, 600 has a similar frequency bandwidth, but has 17 dB higher in the conversion gain and 10 dB lower in the input power.

Figure 10:
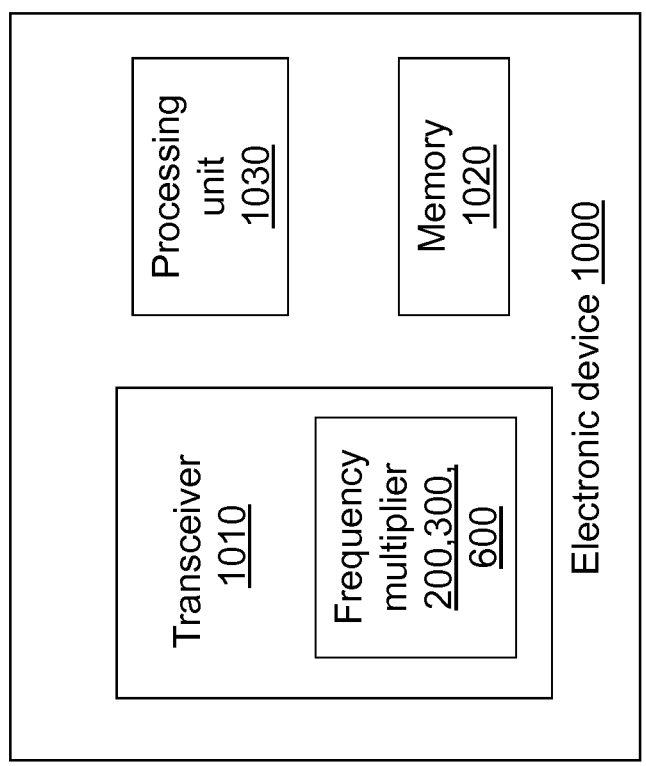
FIG. 10 is a block diagram illustrating an electronic device in which embodiments herein may be implemented.

The frequency multiplier 200, 300, 600 according to embodiments herein is suitable for multi-band transceivers, millimeter or macro wave transceivers, or any general circuits as an RF signal source generator in an electronic device 1000 as shown in FIG. 10.

The electronic device 1000 may be a wireless communication device, such as a frequency modulated continuous wave (FMCW) radar or any device which needs a signal with a frequency 3 times of an input signal frequency. The electronic device 1000 may comprise a Transceiver 1000, wherein the frequency multiplier 200, 300, 600 may be implemented in. The electronic device 1000 may further comprise a Memory 1020 and a Processing unit 1030.

Those skilled in the art will understand that although transistors Q1, Q2 in the frequency multiplier 600 as shown in FIG. 6 are Bipolar Junction Transistors (BJT), the frequency multiplier 600 may comprise any other types of transistors, such as Field-Effect Transistor (FET), Metal-Oxide-Semiconductor FET (MOSFET), Junction FET (JFET), etc. Further, although the multipliers 300, 600 shown in FIGS. 3 and 6 have balanced circuit topology, driven by differential signals. A single-ended circuit topology will work as well.

When using the word "comprise" or "comprising" it shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. A frequency multiplier for generating an output signal from an input signal, wherein a frequency of the output signal is three times a frequency of the input signal, the frequency multiplier comprising:
 a first stage configured to receive an input signal and generate harmonics signals of the input signal;
 a second stage comprising a passive filter, wherein a frequency response of the passive filter has either a peak or a dip around an upper frequency end of a frequency band of the input signal such that, at outputs of the second stage:
  either a power of the first order harmonic signal increases and a power of the second order harmonic signal decreases when the input signal frequency increases; or
  a power of the first order harmonic signal decreases and a power of the second order harmonic signal increases when the input signal frequency increases;
 a third stage configured to mix the first and second order harmonics signals to generate third order harmonic signals; and
 a fourth stage configured to suppress the first and even-order harmonics signals and output a signal dominated with a frequency three times the input signal frequency.

2. The frequency multiplier of claim 1, wherein the first stage comprises a common-emitter configured transistor pair having two inputs to receive a differential input signal and two outputs to generate harmonics signals for the second stage.

3. The frequency multiplier of claim 1:
 wherein the passive filter comprises two identical filters each being connected to one output of the first stage;
 wherein each filter comprises a first inductor or transmission line and a second inductor or transmission line connected in series with a capacitor; wherein one terminal of the first inductor is connected with one terminal of the second inductor and to one output of the first stage, wherein another terminal of the first inductor is connected to a voltage supplier, wherein one terminal of the capacitor is an output of the filter.

4. The frequency multiplier of claim 1:
 wherein the third stage comprises a common-emitter configured transistor pair acting as a trans-conductance mixer to mix the first and second order harmonics signals; and
 wherein the common-emitter configured transistor pair has two inputs to receive signals from the second stage and two outputs to provide mixed signals to the fourth stage.

5. The frequency multiplier of claim 1:
 wherein the fourth stage comprises two coupled transmission lines;
 wherein two terminals on opposite sides of the coupled transmission lines are connected to the two outputs of the third stage respectively;
 wherein two another terminals of the coupled transmission lines are connected to a voltage supplier.

6. The frequency multiplier of claim 5, wherein the fourth stage comprises a capacitor and inductor or transmission line network configured to suppress the first order harmonic signal and for impedance matching.

7. The frequency multiplier of claim 1, further comprising a balun configured to transfer a single-ended input signal into a differential signal to input to the first stage.

8. A multi-band transceiver, comprising:
 a frequency multiplier for generating an output signal from an input signal, wherein a frequency of the output signal is three times a frequency of the input signal, the frequency multiplier comprising:
  a first stage configured to receive an input signal and generate harmonics signals of the input signal;
  a second stage comprising a passive filter, wherein a frequency response of the passive filter has either a peak or a dip around an upper frequency end of a frequency band of the input signal such that, at outputs of the second stage:
   either a power of the first order harmonic signal increases and a power of the second order harmonic signal decreases when the input signal frequency increases; or
   a power of the first order harmonic signal decreases and a power of the second order harmonic signal increases when the input signal frequency increases;
  a third stage configured to mix the first and second order harmonics signals to generate third order harmonic signals; and a fourth stage configured to suppress the first and even-order harmonics signals and output a signal dominated with a frequency three times the input signal frequency.

9. An electronic device, comprising:
a frequency multiplier for generating an output signal from an input signal, wherein a frequency of the output signal is three times a frequency of the input signal, the frequency multiplier comprising:
   a first stage configured to receive an input signal and generate harmonics signals of the input signal;
   a second stage comprising a passive filter, wherein a frequency response of the passive filter has either a peak or a dip around an upper frequency end of a frequency band of the input signal such that, at outputs of the second stage:
      either a power of the first order harmonic signal increases and a power of the second order harmonic signal decreases when the input signal frequency increases; or
      a power of the first order harmonic signal decreases and a power of the second order harmonic signal increases when the input signal frequency increases;
   a third stage configured to mix the first and second order harmonics signals to generate third order harmonic signals; and
   a fourth stage configured to suppress the first and even-order harmonics signals and output a signal dominated with a frequency three times the input signal frequency.

10. A method in a frequency multiplier for generating an output signal with a frequency three times a frequency of an input signal, the method comprising:
   generating harmonics signals of the input signal in a first stage by a common-emitter configured transistor pair;
   shaping the generated harmonics signals in a second stage such that, at outputs of the second stage:
      either a power of the first order harmonic signal decreases and a power of the second order harmonic signal increases when the input signal frequency increases; or
      a power of the first order harmonic signal increases and a power of the second order harmonic signal decreases when the input signal frequency increases;
   mixing first and the second order harmonics signals to generate third order harmonic signals in a third stage by a trans-conductance mixer comprising a common-emitter configured transistor pair; and
   suppressing the first and even-order harmonics signals in a fourth stage by two coupled transmission lines and a capacitor and inductor network.

* * * * *